United States Patent
Ha

(10) Patent No.: US 10,504,829 B2
(45) Date of Patent: Dec. 10, 2019

(54) SEMICONDUCTOR PACKAGE AND SEMICONDUCTOR MODULE INCLUDING THE SAME

(71) Applicant: SAMSUNG ELECTRONICS CO., LTD., Suwon-si, Gyeonggi-do (KR)

(72) Inventor: Jeong-Kyu Ha, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/056,651

(22) Filed: Aug. 7, 2018

(65) Prior Publication Data

US 2019/0189551 A1    Jun. 20, 2019

(30) Foreign Application Priority Data

Dec. 14, 2017  (KR) .................. 10-2017-0172576

(51) Int. Cl.

| H01L 23/00 | (2006.01) |
|---|---|
| H01L 21/56 | (2006.01) |
| H01L 23/498 | (2006.01) |
| H01L 23/31 | (2006.01) |
| H01L 21/48 | (2006.01) |

(52) U.S. Cl.
CPC .... *H01L 23/49838* (2013.01); *H01L 21/4853* (2013.01); *H01L 21/4857* (2013.01); *H01L 21/563* (2013.01); *H01L 23/3185* (2013.01); *H01L 23/4985* (2013.01); *H01L 23/49822* (2013.01); *H01L 24/16* (2013.01); *H01L 2224/16227* (2013.01)

(58) Field of Classification Search
CPC ............... H01L 23/49838; H01L 24/16; H01L 23/3185; H01L 23/49822; H01L 21/4847; H01L 21/4853; H01L 21/563; H01L 23/4985
USPC ........................ 257/668, 671, 673, 688, 692; 438/106.123
See application file for complete search history.

(56) References Cited

U.S. PATENT DOCUMENTS

| 6,300,997 B1 | 10/2001 | Saito et al. |
|---|---|---|
| 6,524,892 B1 | 2/2003 | Kishimoto et al. |

(Continued)

FOREIGN PATENT DOCUMENTS

| JP | H0590344 A | 4/1993 |
|---|---|---|
| JP | 3816038 B2 | 8/2006 |

(Continued)

*Primary Examiner* — Thinh T Nguyen
(74) *Attorney, Agent, or Firm* — Volentine, Whitt & Francos, PLLC

(57) ABSTRACT

A semiconductor package includes a substrate having a top surface on which a semiconductor chip is mounted and a bottom surface opposite the top surface, an upper metal pattern including an upper connection region to which an external electrical device is connected and a chip connection region to which the semiconductor chip is connected, a lower metal pattern including a lower connection region to which other external electrical device is connected, and an intermediate metal pattern electrically connecting the upper and lower metal patterns. The upper metal pattern provides at least three groups of inner leads. The lower metal pattern provides at least three groups of outer leads. A module, such as that of a display device, may include the semiconductor package.

20 Claims, 18 Drawing Sheets

(56) References Cited

U.S. PATENT DOCUMENTS

| | | |
|---|---|---|
| 7,185,429 B2 | 3/2007 | Kusano et al. |
| 9,177,904 B2 | 11/2015 | Jung et al. |
| 9,349,683 B2 | 5/2016 | Jung et al. |
| 9,437,526 B2 | 9/2016 | Lim et al. |
| 9,620,389 B2 | 4/2017 | Ha et al. |
| 9,668,346 B2 | 5/2017 | Shirao et al. |
| 9,818,732 B2 | 11/2017 | Jung et al. |
| 2007/0013857 A1 | 1/2007 | Chung et al. |
| 2008/0024714 A1 | 1/2008 | Park |
| 2009/0303426 A1* | 12/2009 | Kim ................ H05K 1/118 349/118 |
| 2016/0162091 A1 | 6/2016 | Ha et al. |
| 2016/0379968 A1 | 12/2016 | Son et al. |
| 2017/0125314 A1 | 5/2017 | Lim et al. |
| 2017/0250150 A1 | 8/2017 | Konchady et al. |

FOREIGN PATENT DOCUMENTS

| | | |
|---|---|---|
| JP | 3891766 B2 | 3/2007 |
| KR | 20070078591 A | 8/2007 |

\* cited by examiner

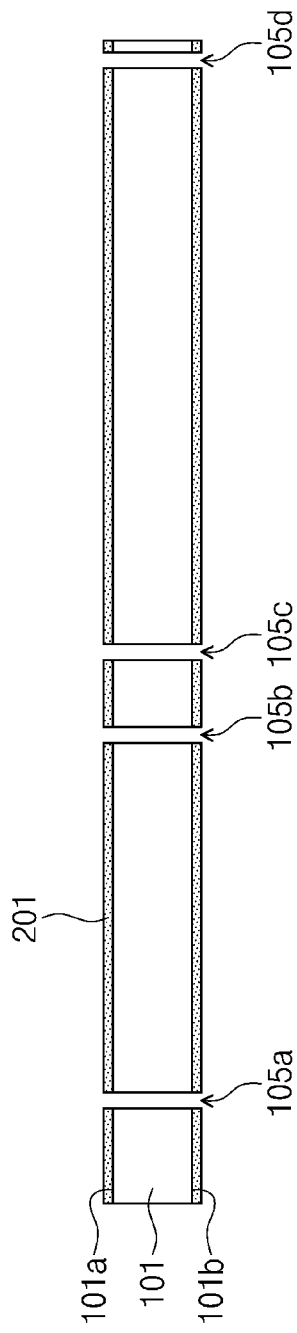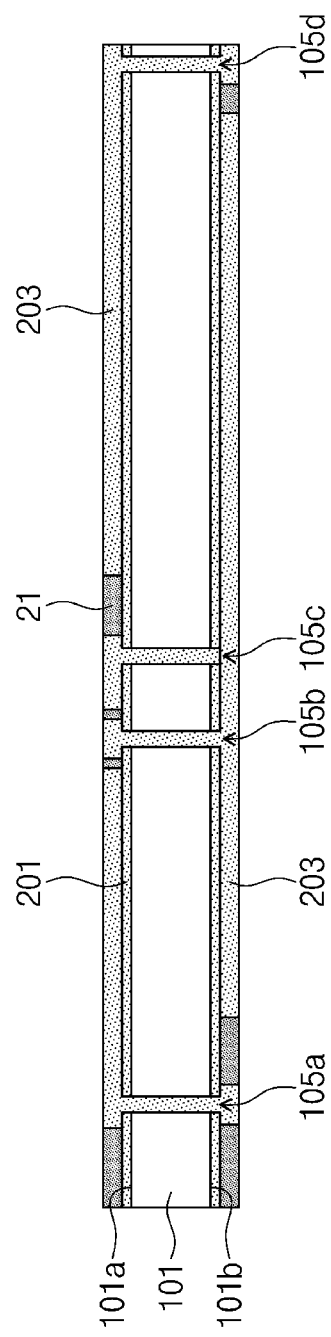

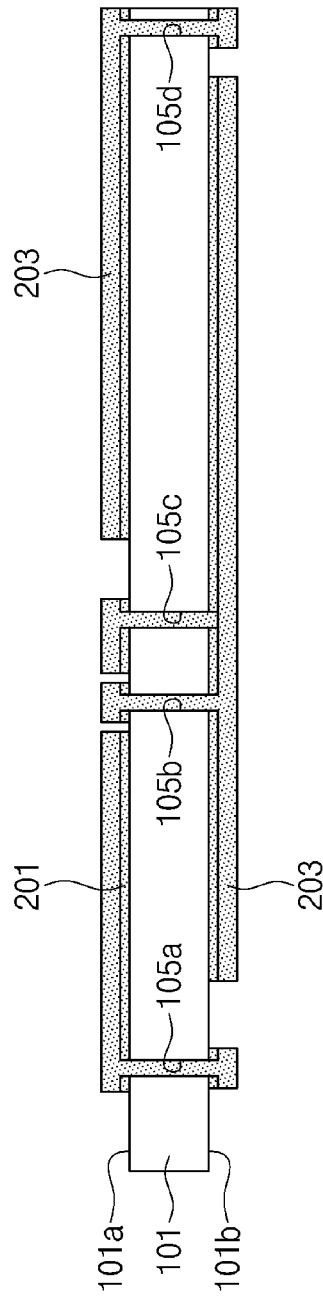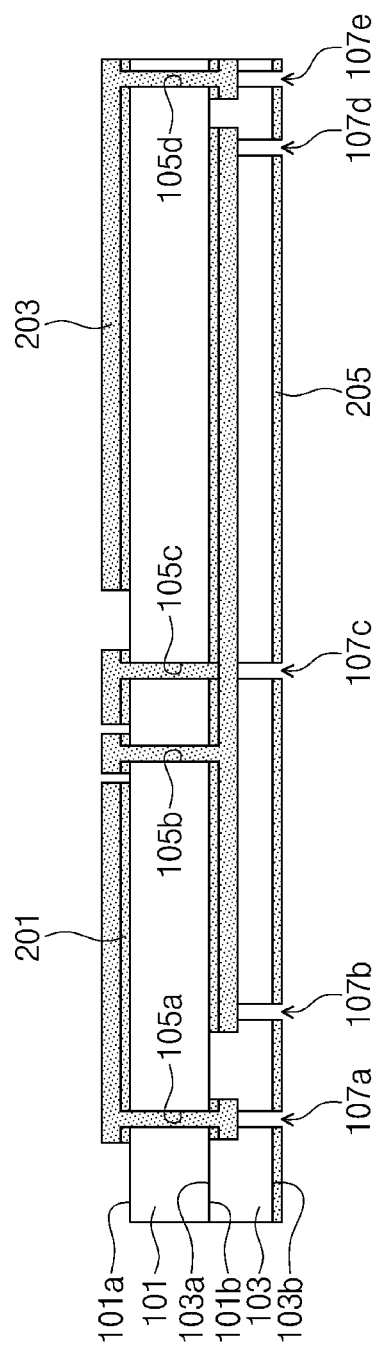

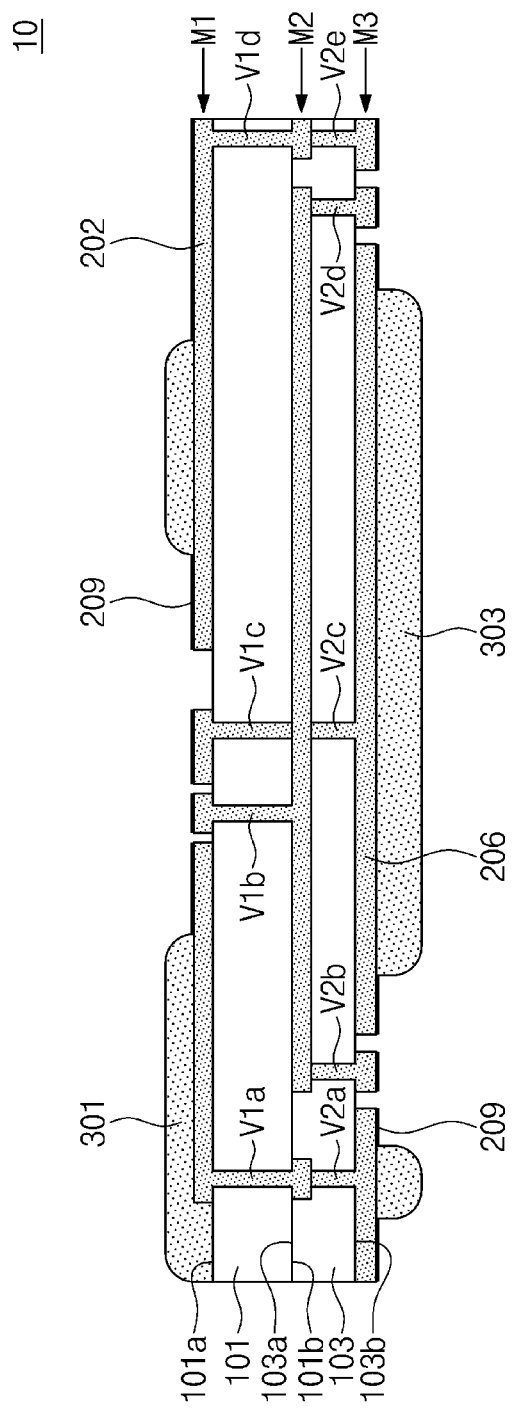

SEMICONDUCTOR PACKAGE AND SEMICONDUCTOR MODULE INCLUDING THE SAME

PRIORITY STATEMENT

This U.S. non-provisional application claims priority under 35 U.S.C § 119 to Korean Patent Application No. 10-2017-0172576 filed on Dec. 14, 2017, in the Korean Intellectual Property Office, the entire contents of which are hereby incorporated by reference.

BACKGROUND

The inventive concepts relate to semiconductor devices, and more particularly, to a semiconductor package and to a semiconductor module including the same.

A semiconductor package is widely used in high performance electronic products such as display devices. The performance of the semiconductor package is a key factor in the resolution offered by the display device. Accordingly, there is a need for semiconductor packages that exhibit a level of performance demanded by high resolution display devices.

SUMMARY

According to the inventive concepts, there is provided a semiconductor package comprising a semiconductor chip, a package substrate having a top surface on which the semiconductor chip is mounted and a bottom surface opposite to the top surface, an upper metal pattern layer on the top surface of the package substrate, the upper metal pattern layer having an upper connection region extending along one section of the top surface of the package substrate and dedicated for electrically connecting an external electrical device to the semiconductor package, and the upper metal pattern layer having a chip connection region at which the semiconductor chip is electrically connected to the upper metal pattern layer, a lower metal pattern layer on the bottom surface of the package substrate, the lower metal pattern layer having a lower connection region extending along one section of the bottom surface of the package substrate and dedicated for electrically connecting another external electrical device to the semiconductor package, and an intermediate metal pattern layer in the package substrate and electrically connecting the upper metal pattern layer and the lower metal pattern layer. The upper metal pattern layer comprises a plurality of first metal patterns comprising leads extending in a longitudinal direction on the top surface of the package substrate. The first metal patterns are disposed in a plurality of groups on the chip connection region. In each of the groups of the first metal patterns, the first metal patterns are spaced relative to each other in a direction intersecting the longitudinal direction in which the leads of the upper metal pattern layer extend, whereas the groups of the first metal patterns are offset from each other in the longitudinal direction in which the leads of the upper metal pattern layer extend. The intermediate metal pattern layer comprises a plurality of second metal patterns. The lower metal pattern layer comprises a plurality of third metal patterns comprising leads extending longitudinally on the bottom surface of the package substrate. Furthermore, in each of the groups of the third metal patterns, the third metal patterns are spaced relative to each other in a direction intersecting the longitudinal direction in which the leads of the lower metal pattern layer extend, whereas the groups of the third metal patterns are offset from each other in the longitudinal direction in which the leads of the lower metal pattern layer extend.

According to the inventive concepts, there is provided a semiconductor package comprising a semiconductor chip, a first substrate having a first top surface on which the semiconductor chip is mounted and a first bottom surface opposite to the first top surface, a second substrate having a second top surface facing the first bottom surface and a second bottom surface opposite to the second top surface, a first metal pattern layer on the first top surface, the first metal pattern layer including a chip connection region at which the semiconductor chip is electrically connected to the first metal pattern layer and an upper connection region dedicated for electrically connecting the semiconductor package to an external electrical device, the upper connection region located along a section of the first top surface, a second metal pattern layer on the first bottom surface and electrically connected to the first metal pattern layer, and a third metal pattern layer on the second bottom surface and electrically connected to the second metal pattern layer, the third metal pattern layer having a lower connection region on a section of the second bottom surface, the lower connection region dedicated for electrically connecting another external electrical device to the semiconductor package. The first metal pattern layer comprises a plurality of first metal patterns comprising leads extending in a longitudinal direction on the first top surface. The first metal patterns are disposed in a plurality of groups on the chip connection region. In each of the groups of the first metal patterns, the first metal patterns are spaced relative to each other in a direction intersecting the longitudinal direction in which the leads of the first metal pattern layer extend, whereas the groups of the first metal patterns are offset from each other in the longitudinal direction in which the leads of the first metal pattern layer extend. The second metal pattern layer comprises a plurality of second metal patterns on the first bottom surface. The third metal pattern layer comprises a plurality of third metal patterns comprising leads extending longitudinally on the second bottom surface. Furthermore, in each of the groups of the third metal patterns, the third metal patterns are spaced relative to each other in a direction intersecting the longitudinal direction in which the leads of the third metal pattern layer extend, whereas the groups of the third metal patterns are offset from each other in the longitudinal direction in which the leads of the third metal pattern layer extend.

According to the inventive concepts, there is provided a semiconductor module comprising a semiconductor package, and a first electrical device and a second electrical device that are electrically connected to the semiconductor package. The semiconductor package may comprise a package substrate including a top surface on which a semiconductor chip is mounted and a bottom surface opposite to the top surface; a first metal pattern including an inner lead bonding region electrically connected to the semiconductor chip and a first outer lead bonding region electrically connected to the first electrical device, the inner lead bonding region on the top surface of the package substrate, the first outer lead bonding region partially exposed on the top surface of the package substrate; a second metal pattern in the package substrate and electrically connected to the first metal pattern; and a third metal pattern on the bottom surface of the package substrate and electrically connected to the second metal pattern, the third metal pattern including a second outer lead bonding region partially exposed on the bottom surface of the package substrate and electrically connected to the second electrical device. On the inner lead bonding region, the first metal pattern may serve as a plurality of inner leads arranged in a plurality of rows. The third metal pattern may serve as a plurality of outer leads exposed on the second outer lead bonding region and arranged in a plurality of rows.

BRIEF DESCRIPTION OF THE DRAWINGS

FIGS. 2A-2C illustrate an example of a semiconductor module according to the inventive concepts, in which FIG. 2A is a cross-sectional of a semiconductor package of the module coupled with a panel and flexible printed circuit board (FPCB) of the module, FIG. 2B is a schematic cross-sectional view of one form of the module, and FIG. 2C is a schematic cross-sectional view of another form of the module.

FIGS. 3A, 3B, 3C, 3D, 3E, 3F, 3G, 3H and 3I are cross-sectional views of a semiconductor package during the course of its manufacture, and together show an example of a method of fabricating a semiconductor package according to the inventive concepts.

DETAILED DESCRIPTION

Examples of semiconductor packages and semiconductor modules including the same according to the inventive concepts will be described hereinafter in detail in conjunction with the accompanying drawings.

FIGS. 1A-1K illustrate examples of a semiconductor package according to the inventive concepts.

Figure 1A:
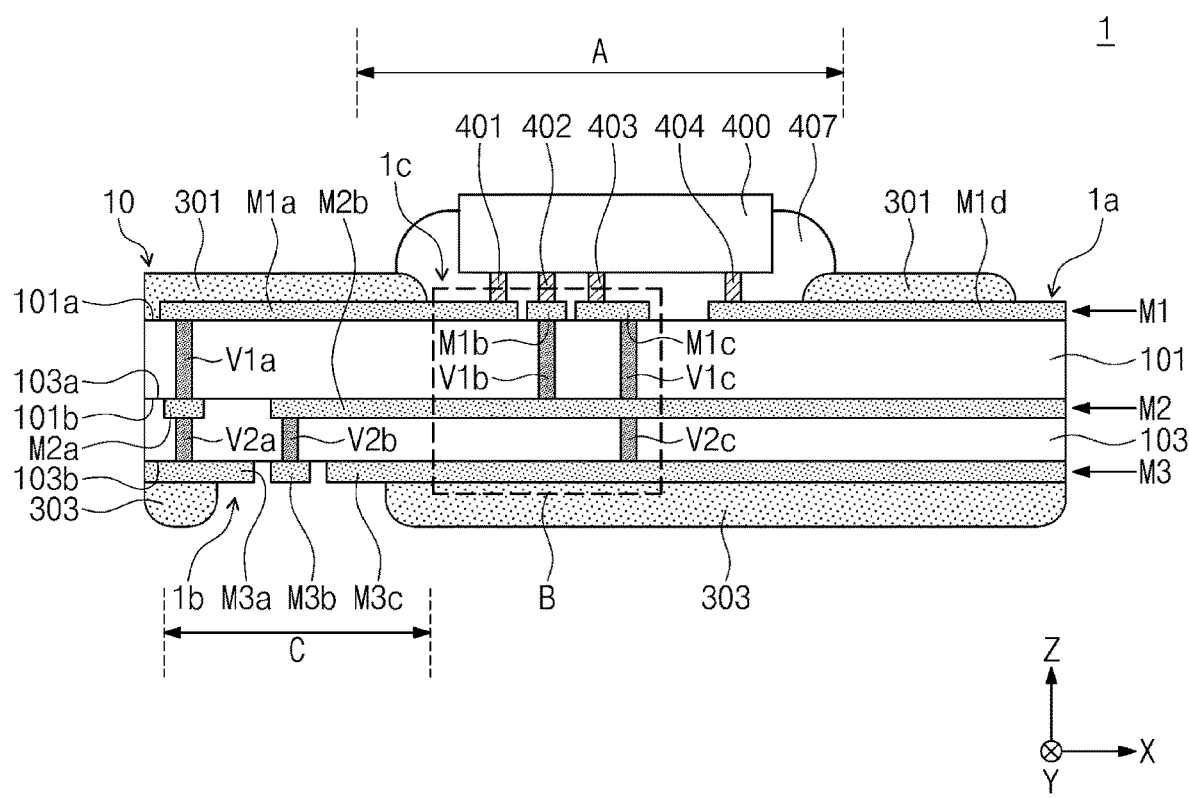
FIG. 1A shows a cross-sectional view of examples of a semiconductor package according the inventive concepts.

Referring to FIG. 1A, semiconductor packages 1 according to the inventive concepts may include a semiconductor chip 400 mounted on a package substrate 10. The semiconductor chip 400 may be a logic chip, a memory chip, or a combination logic and memory chip. For example, the semiconductor chip 400 may include a display driver IC, or DDI. The package substrate 10 may include a flexible printed circuit board. The package substrate 10 may include a first substrate 101 having a top surface 101a on which the semiconductor chip 400 is mounted and a bottom surface 101b opposite to the top surface 101a, and a second substrate 103 provided on the bottom surface 101b of the first substrate 101. The bottom surface 101b of the first substrate 101 may contact a top surface 103a of the second substrate 103. Alternatively, the bottom surface 101b of the first substrate 101 may be attached through an adhesive to the top surface 103a of the second substrate 103.

The first and second substrates 101 and 103 may be flexible substrates of similar flexible material, such as polyimide (PI). Alternatively, one or all of the first and second substrates 101 and 103 may be rigid substrates. The first and second substrates 101 and 103 may have the same or different physical characteristics, such as coefficient of thermal expansion or dielectric constant. For example, the first and second substrates 101 and 103 may have the same or similar coefficient of thermal expansion and/or dielectric constant. Alternatively, the second substrate 103 may have coefficient of thermal expansion and/or dielectric constant less than those of the first substrate 101. In some examples, at least one additional substrate may further be included between the first and second substrates 101 and 103. The additional substrate may be a flexible substrate or a rigid substrate. The first and second substrates 101 and 103 may have the same or different thicknesses (a dimension in a Z direction). For example, the second substrate 103 may have a thickness less than that of the first substrate 101.

The package substrate 10 may include a first metal pattern layer M1 that is electrically connected to the semiconductor chip 400 and electrically connects the semiconductor package 1 to an external electrical device (e.g., a flexible printed circuit board (FPCB)), a third metal pattern layer M3 that electrically connects the semiconductor package 1 to an external electrical device (e.g., a display panel), and a second metal pattern layer M2 that electrically connects the first metal pattern layer M1 and the third metal pattern layer M3 to each other. Alternatively, when at least one additional substrate is further included between the first and second substrates 101 and 103, at least one additional metal pattern layer may be provided.

The first metal pattern layer M1 may have a part serving as an upper (external) connection region 1a that is exposed at the outside of the semiconductor package 1 and is electrically connected to an external electrical device (e.g., a flexible printed circuit board). The third metal pattern layer M3 may have a part serving as a lower (external) connection region 1b that is exposed at the outside the semiconductor package 3 and is electrically connected to an external electrical device (e.g., a display panel). The first metal pattern layer M1 may have another part serving as a chip connection region 1c that is electrically connected to the semiconductor chip 400. For example, the upper and lower connection regions 1a and 1b may be outer lead bonding (OLB) regions, and the chip connection region 1c may be an inner lead bonding (ILB) region.

The upper and lower connection regions 1a and 1b may not be vertically aligned with each other (i.e., may be out of alignment in the Z direction). For example, the upper connection region 1a may be provided on a right-side top surface of the semiconductor package 1, whereas the lower connection region 1b may be provided on a left-side bottom surface of the semiconductor package 1. Alternatively, the upper and lower connection regions 1a and 1b may be vertically aligned with each other (i.e., aligned in the Z direction). The upper connection region 1a and the chip connection region 1c may be horizontally spaced apart from each other along an X direction.

The first to third metal pattern layers M1 to M3 may be sequentially stacked, i.e., dispose one over another along the Z direction. For example, the first metal pattern layer M1 may be provided on the top surface 101a of the first substrate 101, the second metal pattern layer M2 may be provided on the bottom surface 101b of the first substrate 101, and the third metal pattern layer M3 may be provided on a bottom surface 103b of the second substrate 103. The first metal pattern layer M1 may be vertically aligned (aligned in the Z direction) with the third metal pattern layer M3, but not with the second metal pattern layer M2.

An upper passivation layer 301 may be provided on the top surface 101a of the first substrate 101, covering the first metal pattern layer M1. A lower passivation layer 303 may be provided on the bottom surface 103b of the second substrate 103, covering the third metal pattern layer M3. The upper and lower passivation layers 301 and 303 may include an insulating material, such as solder resist. The upper passivation layer 301 may partially expose the first metal pattern layer M1 to thereby define the upper connection region 1a and the chip connection region 1c. The lower passivation layer 303 may partially expose the third metal pattern layer M3 to thereby define the lower connection region 1b.

Figure 1B:
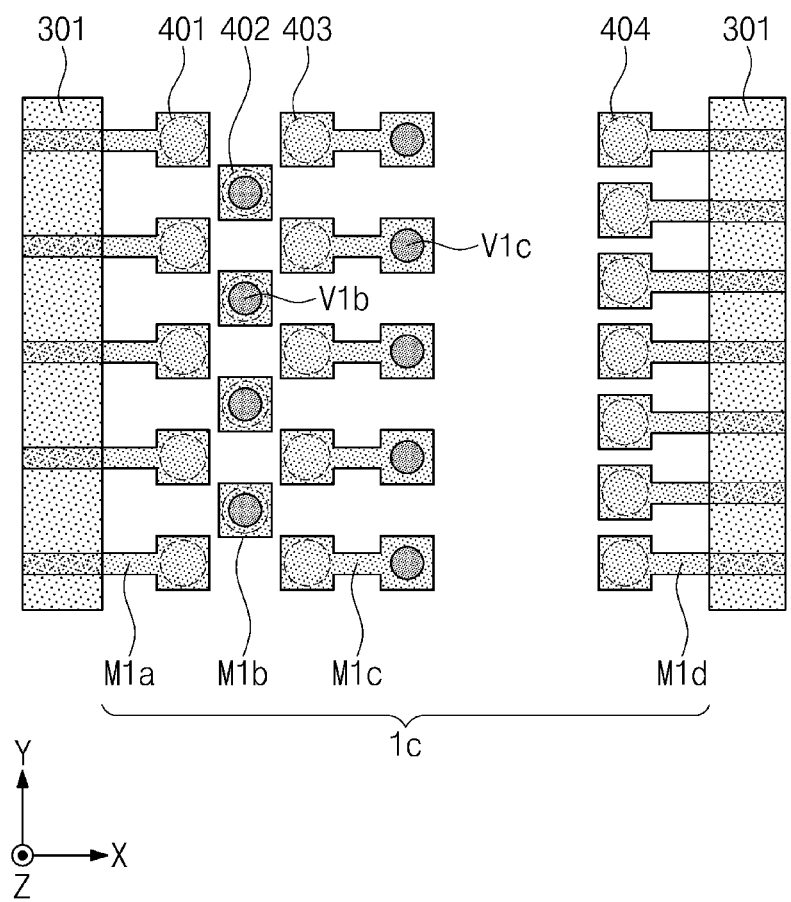
FIG. 1B is a plan view of section A of one of the examples of the semiconductor packages shown by FIG. 1A.

Referring to FIGS. 1A and 1B, the semiconductor chip 400 and the package substrate 10 may be electrically connected to each other through a plurality of connection terminals 401, 402, 403, and 404. The connection terminals 401 to 404 may include a plurality of first output terminals 401 that are arranged in a straight line along a Y direction, a plurality of second output terminals 402 that are spaced apart in the X direction from the first output terminals 401 and arranged in a straight line along the Y direction, a plurality of third output terminals 403 that are spaced apart in the X direction from the second output terminals 402 and arranged in a straight line along the Y direction, and a plurality of input terminals 404 that are spaced apart in the X direction from the third output terminals 403 and arranged in a straight line along the Y direction. Alternatively, a plurality of additional output terminals may further be interposed between the third output terminals 403 and the input terminals 404. The X and Y directions may intersect each other, e.g., may be perpendicular to each other. The Z direction is perpendicular to the X and Y directions. The Y direction may be a row direction, i.e., a direction in which like features are spaced relative to each other to form a row or discrete group of those features. The X direction may be parallel to "extending" directions of the first to third metal patterns M1 to M3 as will be described in more detail below.

The semiconductor chip 400 and the package substrate 10 may be provided therebetween with an under-fill layer 407 protecting the connection terminals 401 to 404 from the outside and/or preventing contact between the connection terminals 404 to 404. The under-fill layer 407 may partially cover the semiconductor chip 400. Alternatively, the under-fill layer 407 may fully cover the semiconductor chip 400.

The first metal pattern layer M1 may be coupled to the connection terminals 401 to 404 on the chip connection region 1c. The first metal pattern layer M1 may include a plurality of first outer metal patterns M1a coupled to the first output terminals 401, a plurality of first intermediate metal patterns M1b coupled to the second output terminals 402, a plurality of first inner metal patterns M1c coupled to the third output terminals 403, and a plurality of input metal patterns M1d coupled to the input terminals 404. Thus, the metal patterns M1a, M1b, M1c, and M1d may be electrically connected to the semiconductor chip 400. The input metal patterns M1d may not be fully covered with the upper passivation layer 301, but partially exposed through the upper connection region 1a. The plurality of input metal patterns M1d may have an exposed end constituting the upper connection region 1a, serving as an input for the package. In the example illustrated in FIG. 1B, each of the metal patterns M1a, M1C and M1d comprises a lead extending longitudinally in the X direction, whereby the X direction is the "extending" direction of the first metal pattern layer M1. Also, in the example illustrated in FIG. 1B, each of the metal patterns M1a, M1C and M1d comprises a metal pad serving as a connection point for the lead. Thus, a metal "pattern" as referred to herein may describe an element, as shown in the figures, having a lead and/or a pad.

The first outer metal patterns M1a may be arranged in a straight line along the Y direction. Likewise, the first intermediate metal patterns M1b, the first inner metal patterns M1c, and the input metal patterns M1d may also be arranged in a straight line along the Y direction.

Figure 1C:
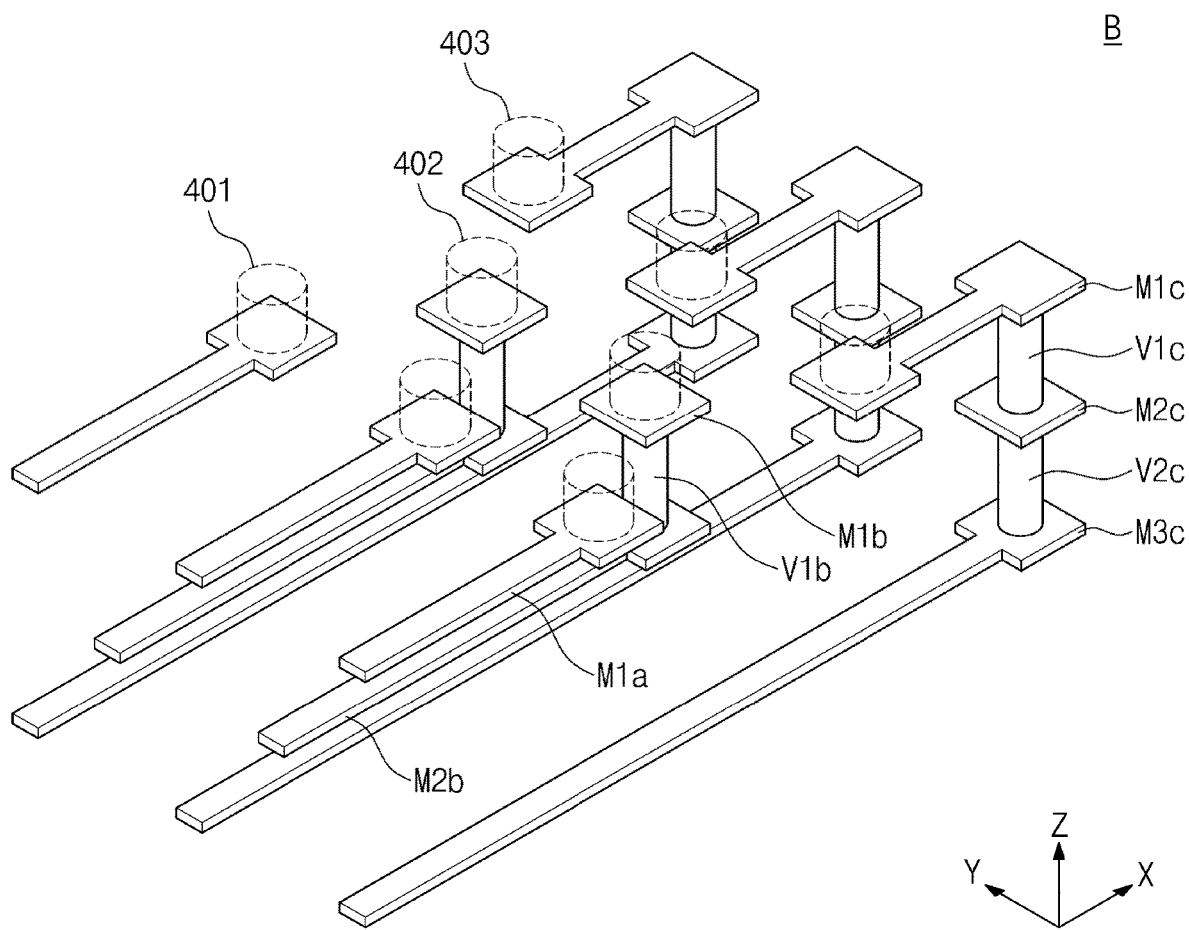
FIGS. 1C and 1D are perspective views of respective parts of section B of an example of the semiconductor packages shown by FIG. 1A.

The second metal pattern layer M2 may be electrically connected to the first metal pattern layer M1. The second metal pattern layer M2 may include a plurality of second outer metal patterns M2a electrically connected to the first outer metal patterns M1a through a plurality of first outer metal vias V1a, a plurality of second intermediate metal patterns M2b electrically connected to the first intermediate metal patterns M1b through a plurality of first intermediate metal vias V1b, and as illustrated in FIG. 1C, a plurality of second inner metal patterns M2c electrically connected to the first inner metal patterns M1c through a plurality of first inner metal vias V1c. The first outer metal vias V1a, the first intermediate metal vias V1b, and the first inner metal vias V1c may extend through the first substrate 101.

The first outer and inner metal patterns M1a and M1c neighboring one another in the X direction may be disposed in a straight line, and the first intermediate metal pattern M1b may be offset in the Y direction relative to the first outer metal patterns M1a and likewise, may be offset in the Y direction relative to the first inner metal patterns M1c neighboring along the Y direction. Specifically, as viewed in the X direction, each first intermediate metal pattern M1b may be located between neighboring ones of a respective pair of the first outer metal patterns M1a. Likewise, as viewed in the X direction, each first intermediate metal pattern M1b may be located between neighboring ones of a respective pair of the inner metal patterns M1c. Also, the first intermediate metal vias V1b may be arranged in a straight line along the Y direction, the first inner metal vias V1c may be arranged in a straight line along the Y direction, and the first intermediate metal vias V1b may be offset in the X direction with the first inner metal vias V1c.

At least one of the second intermediate metal patterns M2b may be used when the semiconductor chip 400 or the semiconductor package 1 is under an electrical test, and others of the second intermediate metal patterns M2b may be used when the semiconductor chip 400 or the semiconductor package 1 is under an actual electrical operation.

For example, referring to FIG. 1C, respective ones of the second intermediate metal patterns M2b may extend along a direction opposite to the X direction from below the first intermediate metal vias V1b toward positions below the first outer metal patterns M1a. These second intermediate metal patterns M2b extending in the direction opposite to the X direction may be used when the semiconductor package 1 is under actual electrical operation.

Figure 1D:
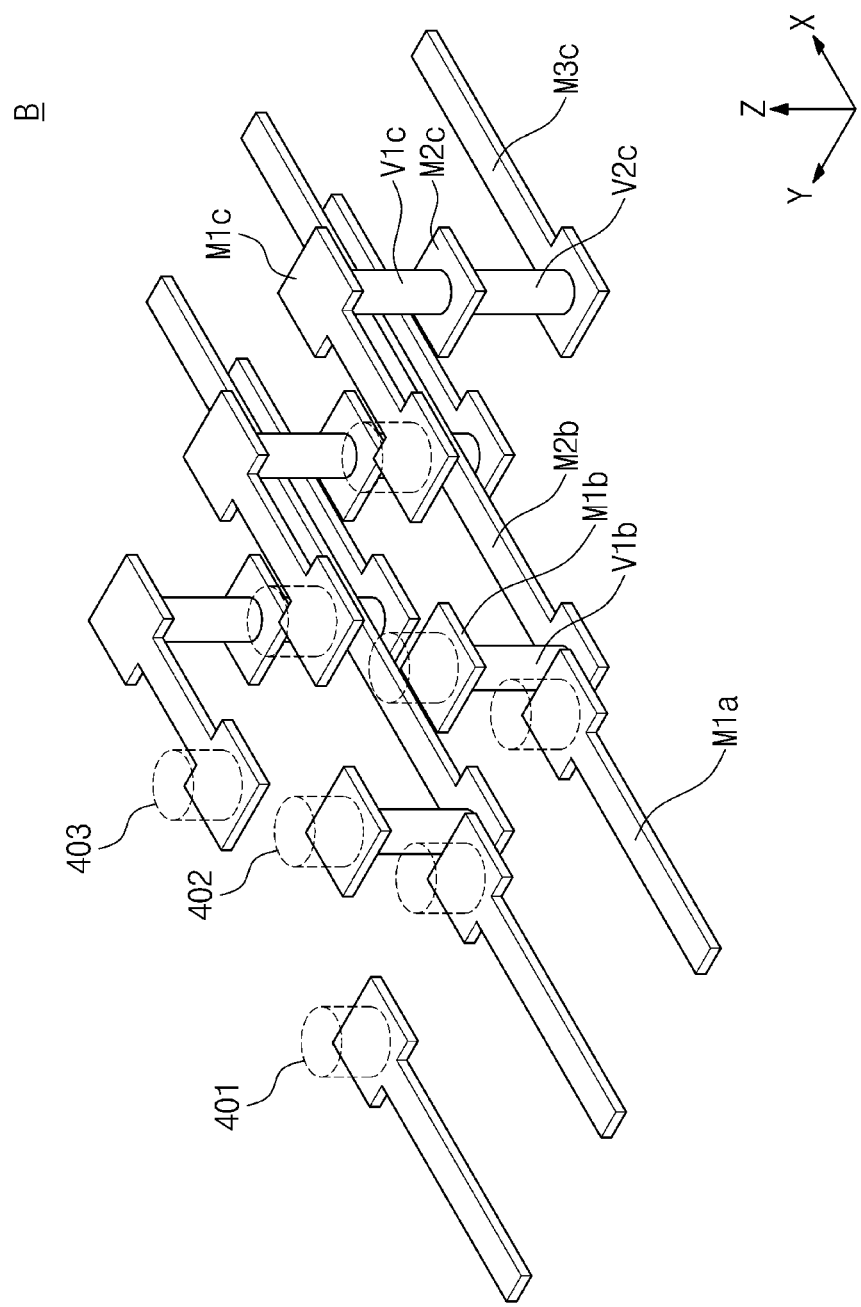

In contrast, referring to FIG. 1D, others (the remainder) of the second intermediate metal patterns M2b may extend along the X direction from below the first intermediate metal vias V1b toward positions below the first inner metal patterns M1c. The second intermediate metal patterns M2b extending in the X direction may be used when the semiconductor package 1 is under an electrical test.

For ease of illustration, FIG. 1A shows that the second intermediate metal pattern M2b continuously extends in both the X direction and its opposite direction from a position below the first intermediate metal via V1b. However, each second intermediate metal pattern M2b may actually extend either in a direction opposite to the X direction as illustrated in FIG. 1C or in the X direction as illustrated in FIG. 1D.

The third metal pattern layer M3 may be electrically connected to the second metal pattern layer M2. The third metal pattern layer M3 may include a plurality of third outer metal patterns M3a electrically connected to the second outer metal patterns M2a through a plurality of second outer metal vias V2a, a plurality of third intermediate metal patterns M3b electrically connected to the second intermediate metal patterns M2b through a plurality of second intermediate metal vias V2b, and a plurality of third inner metal patterns M3c electrically connected to the second inner metal patterns M2c, as illustrated in FIG. 1C, through a plurality of second inner metal vias V2c. The second outer metal vias V2a, the second intermediate metal vias V2b, and the second inner metal vias V2c may extend through the second substrate 103.

The first outer metal vias V1a may be vertically aligned (i.e., aligned in the Z direction) with the second outer metal vias V2a. The first inner metal vias V1c may be vertically aligned (i.e., aligned in the Z direction) with the second inner metal vias V2c.

At least one of the third inner metal patterns M3c may be used when the semiconductor package 1 is under an electrical test, and others of the third inner metal patterns M3c may be used when the semiconductor package 1 is under an actual electrical operation.

For example, as illustrated in FIG. 1C, respective ones of the third inner metal patterns M3c may extend along the direction opposite to the X direction from below the second inner metal vias V2c. The third inner metal patterns M3c extending in the direction opposite to the X direction may be used when the semiconductor package 1 is under an actual electrical operation.

In contrast, referring to FIG. 1D, the rest of the third inner metal patterns M3c may extend along the X direction from below the second inner metal vias V2c. The third inner metal patterns M3c extending in the X direction may be used when the semiconductor package 1 is under an electrical test.

For ease of illustration, FIG. 1A shows that the third inner metal pattern M3c continuously extends in both the X direction and its opposite direction from a position below the second inner metal via V2c. However, each third inner metal pattern M3c may actually extend either in the direction opposite to the X direction as illustrated in FIG. 1C or in the X direction as illustrated in FIG. 1D.

In some examples, as illustrated in FIG. 1B, the first outer metal patterns M1a may be redistribution lines having pads, or ends coupled to the first output terminals 401. The pads of the first outer metal patterns M1a may be arranged in a straight line along the Y direction. The first inner metal patterns M1c and the input metal patterns M1d may be redistributed, and may include pads arranged in a straight line along the Y direction. The first intermediate metal patterns M1b may have a non-distributed pad shape, and the second output terminals 402 may be coupled to the first intermediate metal patterns M1b. The first intermediate metal vias V1b may be provided directly below the first intermediate metal patterns M1b, and vertically aligned (i.e. aligned in the Z direction) with the second output terminals 402. The second inner metal patterns M2c may have a pad shape as illustrated in FIG. 1C or 1D.

Figure 1E:
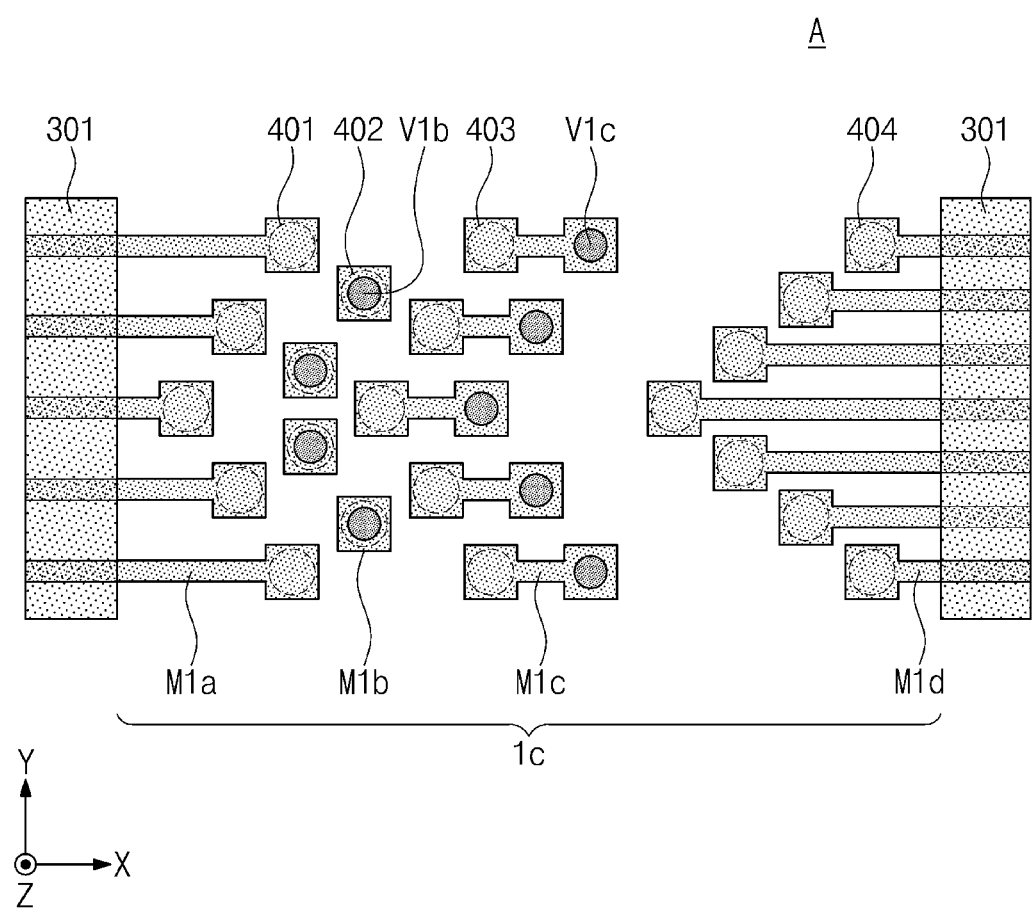
FIG. 1E is a plan view of section A of another one of the examples of the semiconductor packages shown by FIG. 1A.

In other examples, as illustrated in FIG. 1E, the pads of the first outer metal patterns M1a are not arranged in a straight line. In this case, the first outer metal patterns M1a may have a minimal pitch while the number of first outer metal patterns M1a per unit area is maximized. The first intermediate metal patterns M1b, the first inner metal patterns M1c, and the input metal patterns M1d may be similarly arranged so as to also provide such spatial advantages in terms of their density.

Figure 1F:
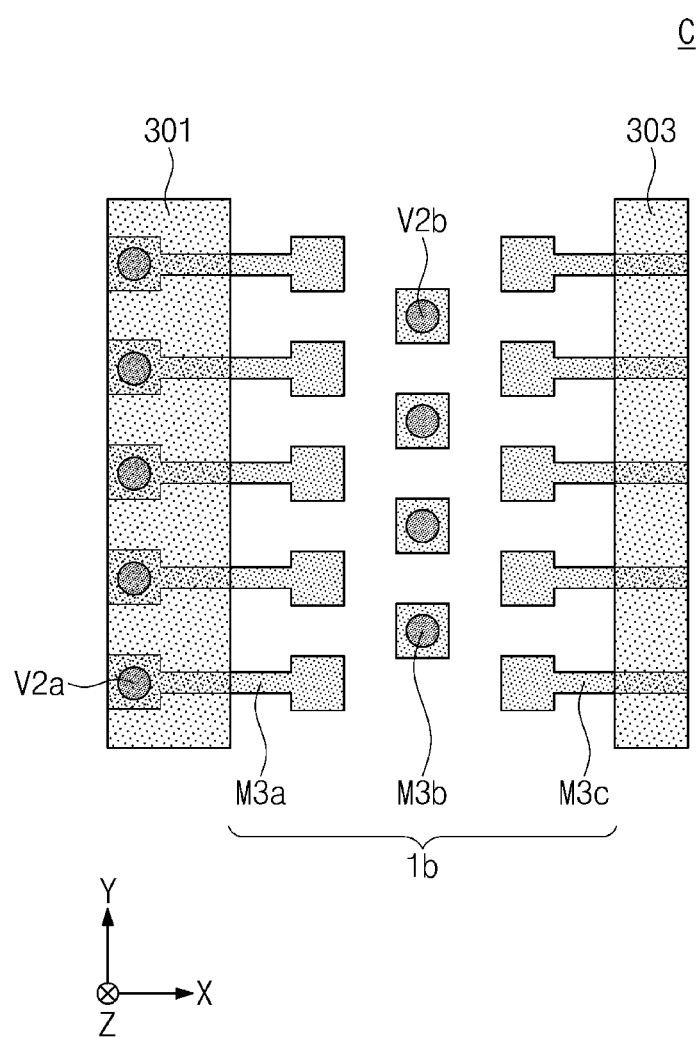
FIG. 1F is a bottom view of section C of one of the examples of the semiconductor packages shown by FIG. 1A.

Referring to the example illustrated in FIG. 1F, the third outer metal patterns M3a and the third intermediate metal patterns M3b may not be covered with the lower passivation layer 303, and may include pads exposed on the lower connection region 1b. The third outer metal patterns M3a and the third intermediate metal patterns M3b exposed on the lower connection region 1b may serve as output terminals, and may be electrically connected to an external electrical device (e.g., a display panel). For example, the third outer metal patterns M3a and the third intermediate metal patterns M3b exposed on the lower connection region 1b may act as outer leads.

The third inner metal patterns M3c extending along the direction opposite to the X direction as discussed above with reference to FIG. 1C may include pads exposed on the lower connection region 1b. The third inner metal patterns M3c exposed on the lower connection region 1b may serve as output terminals, and may be electrically connected to an external electrical device (e.g., a display panel). For example, the third inner metal patterns M3c exposed on the lower connection region 1b may act as outer leads.

The third outer metal patterns M3a, the third intermediate metal patterns M3b, and the third inner metal patterns M3c may be arranged either in a straight line along the Y direction or as staggered relative to one another as viewed along the Y direction as illustrated in FIG. 1E.

Figure 1G:
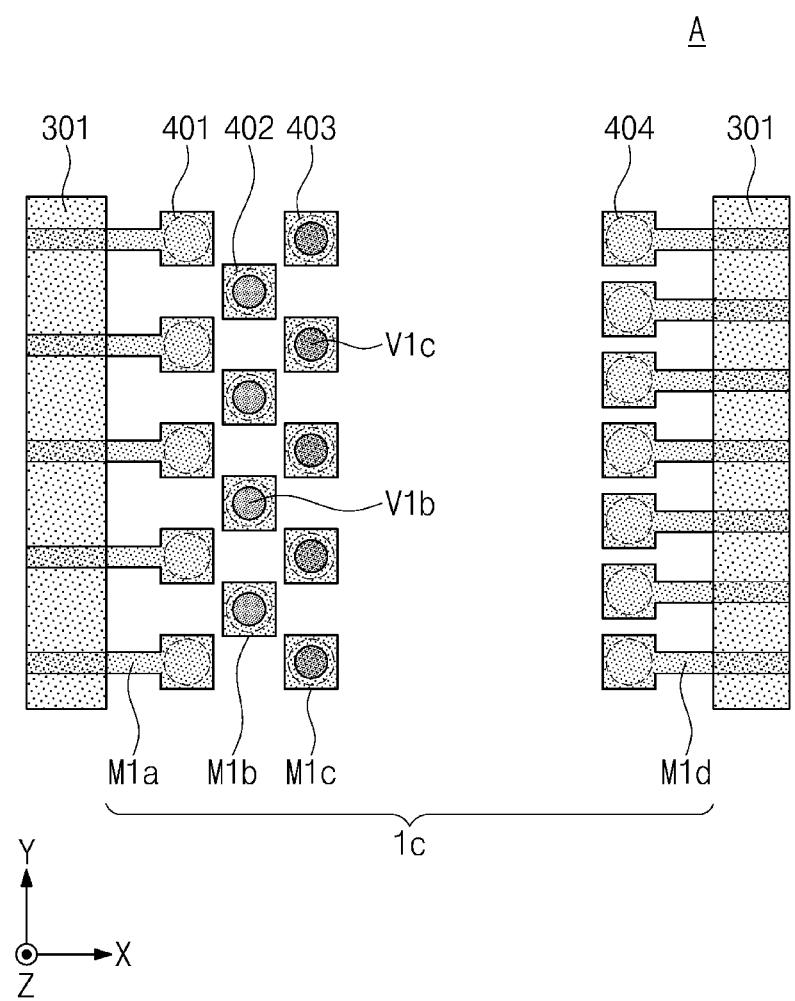
FIG. 1G is a plan view of section A of another one of the examples of the semiconductor packages shown by FIG. 1A.
Figure 1H:
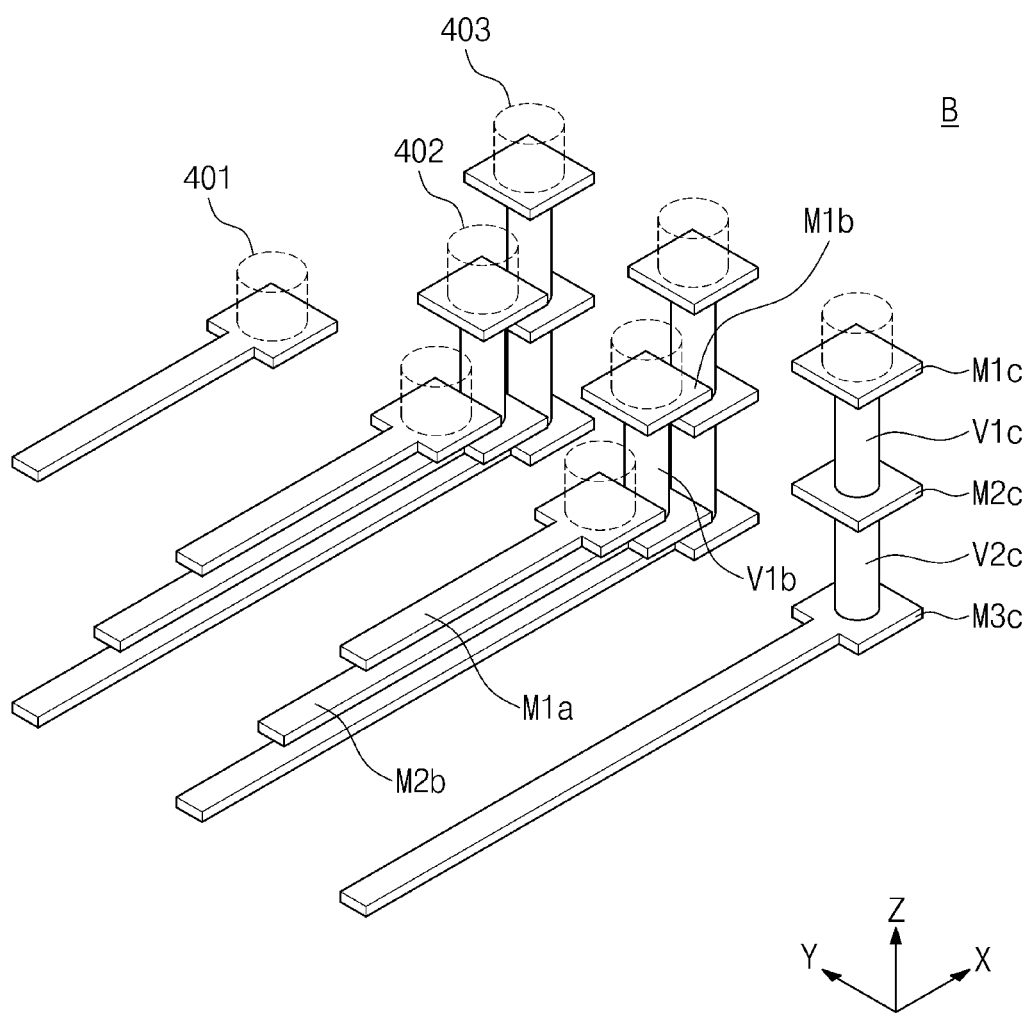
FIG. 1H is a perspective view of section B of another of the examples of the semiconductor packages shown by FIG. 1A.

Referring to the example shown in FIGS. 1G and 1H, like the first intermediate metal patterns M1b, the first inner metal patterns M1c may have a non-distributed pad shape, and the third output terminals 403 may be coupled to the first inner metal patterns M1c. The first inner metal vias V1c may be provided directly below the first inner metal patterns M1c, and vertically aligned in the Z direction with the third output terminals 403 and the second inner metal vias V2c.

According to the inventive concepts, the output terminals 401 to 403 may be arranged in at least three rows or other row-like arrangements (groups) offset in the X direction. In addition, pads coupled to the output terminals 401 to 403, respectively, may thus also be arranged in at least three rows or groups offset in the X direction. As is mentioned above, the package substrate 10 may be provided thereon with the first to third metal pattern layers M1 to M3 coupled to the output terminals 401 to 403 so arranged. In each of the first and third metal pattern layers M1 and M3, the metal patterns may be arranged in at least three rows or groups offset from each other in the X direction, i.e., the direction in which the leads of the metal pattern layer extend. Accordingly, the semiconductor package 1 can be produced without misalignment of and/or electrical short between the leads provided by the first to third metal pattern layers M1 to M3, especially when the semiconductor package 1 is employed in a high resolution display having a relatively large number of channels (e.g., 4000 channels or more) and small channel pitch (e.g., 7 to 9 μm or less).

Figure 1I:
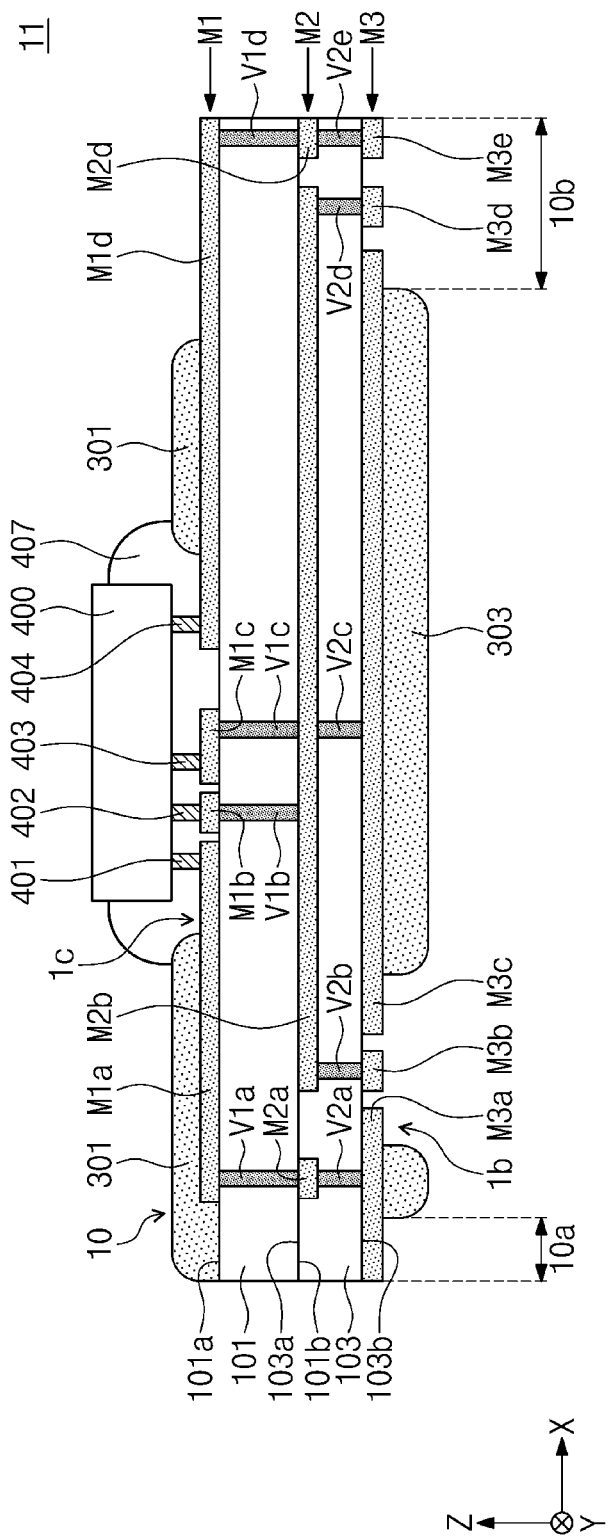
FIG. 1I is a cross-sectional view of another example of a semiconductor package according to the inventive concepts.

FIG. 1I illustrates another example of a semiconductor package according to the inventive concepts.

Referring to FIG. 1I, the semiconductor package 11 may be similar to the semiconductor package 1. The semiconductor package 11 may further include an electrical test structure on one end 10a and an opposite end 10b thereof.

For example, at least one of the third outer metal patterns M3a may be used when the semiconductor package 11 is under an electrical test, and others of the third outer metal patterns M3a may be used when the semiconductor package 11 is under an actual electrical operation.

For example, respective ones of the third outer metal patterns M3a may extend along the direction opposite to the X direction from below the second outer metal vias V2a. The third outer metal patterns M3a extending along the direction opposite to the X direction may be exposed on the one end 10a of the semiconductor package 11, and may serve as output terminals of test signals provided from the first output terminals 401.

In contrast, the rest of the third outer metal patterns M3a may extend along the X direction from below the second outer metal vias V2a. The third outer metal patterns M3a extending along the X direction may be exposed on the lower connection region 1b and used when the semiconductor package 11 is under an actual electrical operation.

Each of the second intermediate metal patterns M2b, which extend along the X direction from below the first intermediate metal vias V1b as discussed above with reference to FIG. 1D, may be electrically connected through a test via V2d extending through the second substrate 103 to a test metal pattern M3d provided on the bottom surface 103b of the second substrate 103. The test metal pattern M3d may be a part of the third metal pattern layer M3, and may serve as an output terminal of a test signal provided from the second output terminal 402.

When the semiconductor package 11 is under an electrical test, the semiconductor package 11 may use the third inner metal patterns M3c extending along the X direction from below the second inner metal vias V2c as discussed above with reference to FIG. 1D. Each of the third inner metal patterns M3c extending along the X direction may be exposed on the opposite end 10b of the semiconductor package 11, and may serve as an output terminal of a test signal provided from the third output terminal 403.

One or all of the input metal patterns M1d may be electrically connected to a test metal via V1d extending through the first substrate 101, to a test metal pad M2d that is provided on the bottom surface 101b of the first substrate 101 and is a part of the second metal pattern layer M2, and to a test metal pattern M3e that is provided on the bottom surface 103b of the second substrate 103 and is a part of the third metal pattern layer M3. The test metal via V1d may be vertically aligned (i.e., aligned in the Z direction) with the test metal via V2e. When the input metal pattern M1d receives a test signal through the test metal pattern M3e, the semiconductor package 11 may be under an electrical test. One or all of the input metal patterns M1d may be used when the electrical test is performed.

Figure 2A:
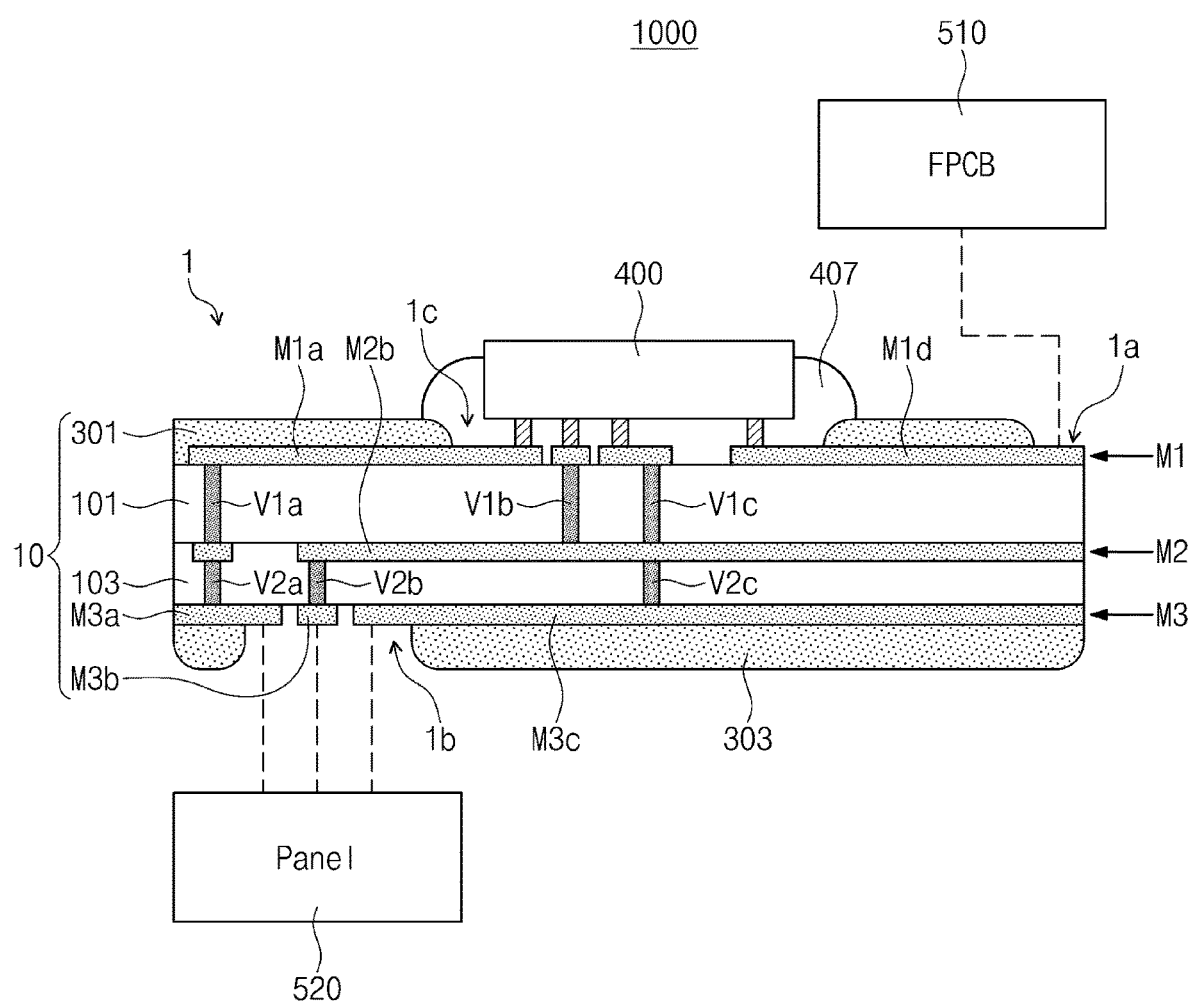
Figure 2B:
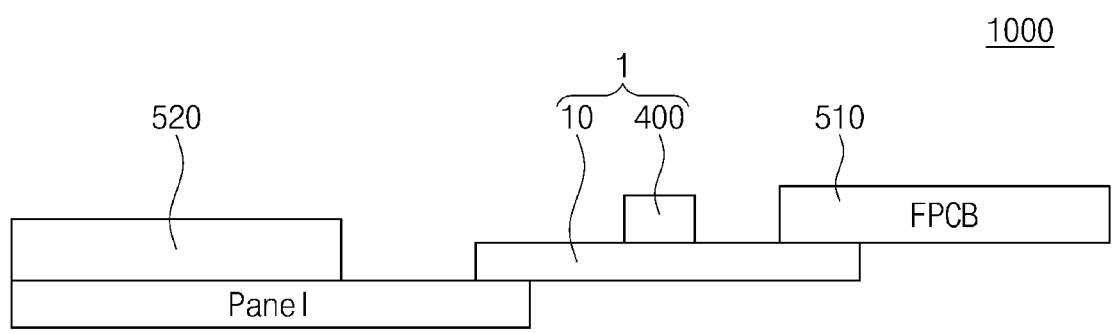
Figure 2C:
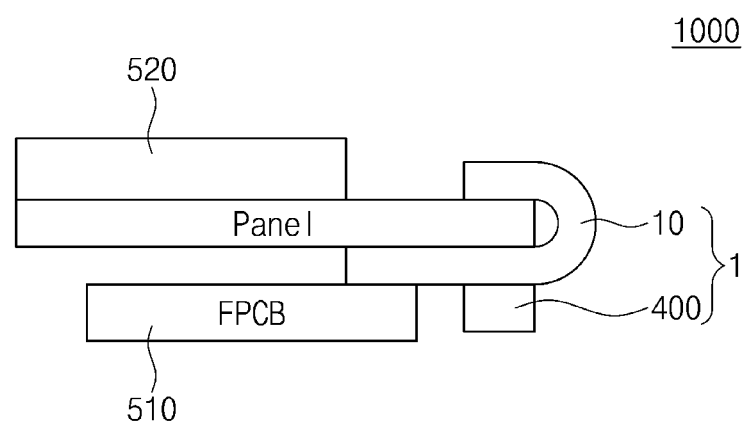

FIGS. 2A to 2C are conceptual diagrams showing semiconductor modules according to the inventive concepts.

Referring to FIG. 2A, the semiconductor module 1000 may include the semiconductor package and first and second external electrical devices 510 and 520 electrically connected to the semiconductor package 1. The first external electrical device 510 may be electrically connected to the input metal patterns M1d exposed on the upper connection region 1a, and the second external electrical device 520 may be electrically connected to the third outer metal patterns M3a, the third intermediate metal patterns M3b, and the third inner metal patterns M3c exposed on the lower connection region 1b. The first external electrical device 510 may be a flexible printed circuit board (FPCB), and the second external electrical device 520 may be a display panel.

The display panel may be a non-touch or touch display panel of a mobile apparatus, a non-touch or touch display panel of a computer or TV, or the like.

The chain lines in FIG. 2A indicate direct or indirect electrical connections. The semiconductor package 1 may receive electrical signals through the upper connection region 1a from the first external electrical device 510, and the received electrical signals may be output through the lower connection region 1b to the second external electrical device 520.

The first and second external electrical devices 510 and 520 may be electrically connected across the semiconductor package 1 in a straight state as illustrated in FIG. 2B or in a bent state as illustrated in FIG. 2C. The semiconductor module may include the semiconductor package 11 of FIG. 1I instead of the semiconductor package 1.

FIGS. 3A to 3I illustrate a method of fabricating a semiconductor package according to the inventive concepts.

Referring to FIG. 3A, a first substrate 101 may be provided to have a first seed layer 201 on each of a top surface 101a and a bottom surface 101b thereof and to have a plurality of first via holes 105a to 105d extending therethrough. The first substrate 101 may be a flexible or rigid substrate. For example, the first substrate 101 may be a flexible substrate of polyimide (PI). The first seed layer 201 may include nickel (Ni), chromium (Cr), copper (Cu), or a combination thereof. After the first seed layer 201 is formed on each of the top surface 101a and the bottom surface 101b of the first substrate 101, a laser may be used to drill through the first seed layers 201 and the substrate 101 to form the first via holes 105a to 105d. When viewed in plan, one 105c of the first via holes 105a to 105d may be in positional misalignment with other via holes 105a, 105b, and 105d disposed on the same line. After the first via holes 105a to 105d are formed, the first substrate 101 may be subjected to a plating process to form conductive vias in the first via holes 105a to 105d.

For example, referring to FIG. 3B, a first photosensitive layer 21 may be formed, and a first plating layer 203 may be formed. The first photosensitive layer 21 may be formed on the top and bottom surfaces 101a and 101b of the first substrate 101 by sequentially performing a dry film resist lamination process, an exposure process, and a development process. The first plating layer 203 may be formed by plating the resultant structure with copper. The first plating layer 203 may be formed on the top and bottom surfaces 101a and 101b of the first substrate 101 and within the first via holes 105a to 105d.

Referring to FIG. 3C, the first photosensitive layer 21 may be removed, and a removal process may be performed on the first seed layer 201 exposed by the removal of the first photosensitive layer 21. The removal of the first seed layer 201 may partially expose the top and bottom surfaces 101a and 101b of the first substrate 101. The first plating layer 203 on the bottom surface 101b of the first substrate 101 may be connected to the first plating layer 203 filling the via hole 105b among the first via holes 105a to 105d, but not to the first plating layer 203 filling other via holes 105a, 105c, and 105d.

Referring to FIG. 3D, a second substrate 103 may be provided on the bottom surface 101b of the first substrate 101, and a laser drilling process may be performed to form second via holes 107a to 107e in the second substrate 103. The second substrate 103 may be a flexible or rigid substrate. For example, the second substrate 103 may be a flexible substrate of polyimide (PI). Before the laser drilling process is performed, a second seed layer 205 may be formed on a bottom surface 103b of the second substrate 103. The second seed layer 205 may include nickel (Ni), chromium (Cr), copper (Cu), or a combination thereof. A top surface 103a of the second substrate 103 may either contact the bottom surface 101b of the first substrate 101 or an adhesive may be provided between the top surface 103a of the second substrate 103 and the bottom surface 101b of the first substrate 101. After the second via holes 107a to 107e are formed, the second substrate 103 may be subjected to a plating process to form vias in the second via holes 107a to 107e to become conductive.

Figure 3E:
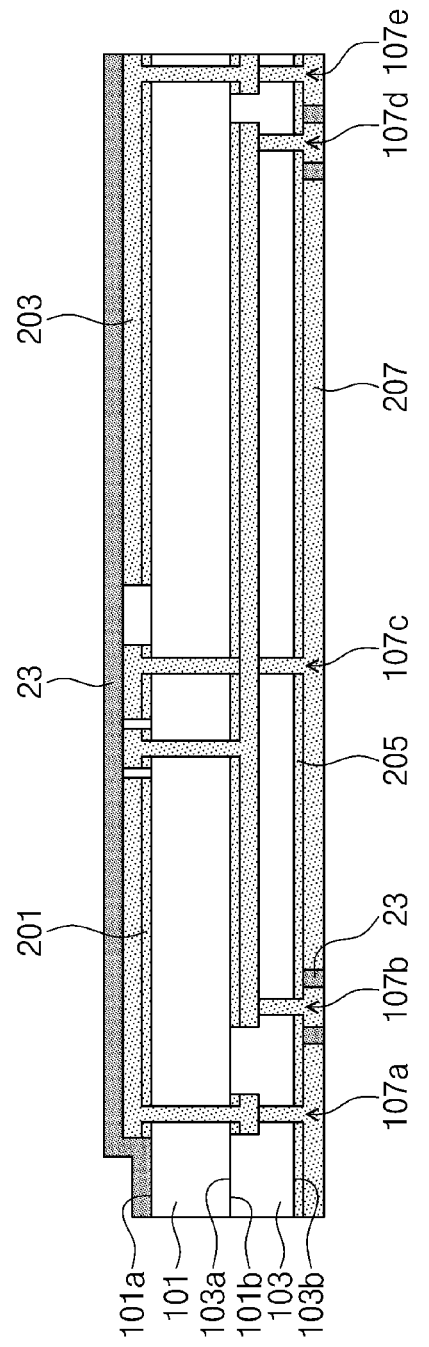

For example, referring to FIG. 3E, a second photosensitive layer 23 may be formed, and a second plating layer 207 may be formed. The second photosensitive layer 23 may be formed on the top surface 101a of the first substrate 101 and the bottom surface 103b of the second substrate 103 by sequentially performing a dry film resist lamination process, an exposure process, and a development process. The second photosensitive layer 23 on the top surface 101a of the first substrate 101 may cover the first plating layer 203 on the top surface 101a of the first substrate 101. The second plating layer 207 may be formed on the bottom surface 103b of the second substrate 103 and within the second via holes 107a to 107e.

Figure 3F:
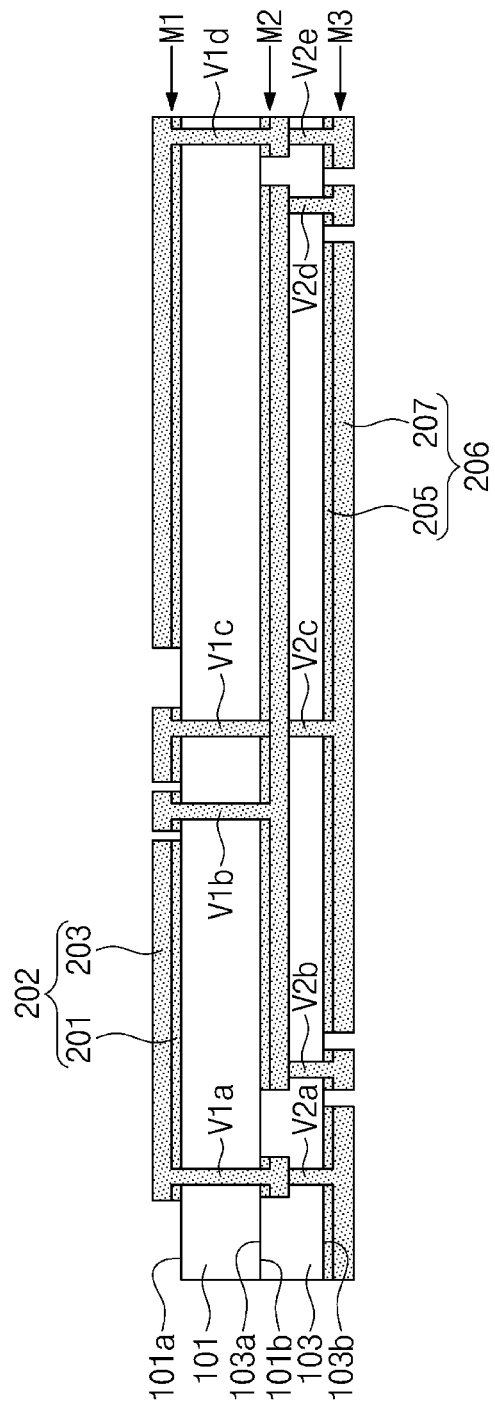

Referring to FIG. 3F, the second photosensitive layer 23 may be removed, and a removal process may be performed on the second seed layer 205 exposed by the removal of the second photosensitive layer 23. The removal of the second seed layer 205 may partially expose the bottom surface 103b of the second substrate 103. The first seed layer 201 and the first plating layer 203 may constitute a metal layer 202 that includes a first metal pattern layer M1 on the top surface 101a of the first substrate 101 and includes a second metal pattern layer M2 on the bottom surface 101b of the first substrate 101. The second seed layer 205 and the second plating layer 207 may constitute a metal layer 206 including a third metal pattern layer M3 on the bottom surface 103b of the second substrate 103. The first to third metal patterns M1 to M3 may correspond to the first to third metal patterns M1 to M3 of the semiconductor package 11 discussed above with reference to FIG. 1I.

The metal layer 202 may further include first metal vias V1a to V1d extending through the first substrate 101. The metal layer 206 may further include second metal vias V2a to V2e extending through the second substrate 103. The first metal vias V1a to V1d may correspond to the metal vias V1a to V1d of the semiconductor package 11. The second metal vias V2a to V2e may correspond to the metal vias V2a to V2e of the semiconductor package 11.

Referring to FIG. 3G, a solder resist printing process may be performed to form passivation layers 301 and 303, which process may essentially complete the fabricating of a package substrate 10. The passivation layers 301 and 303 may include an upper passivation layer 301 provided on the top surface 101a of the first substrate 101 and partially covering the first metal pattern layer M1 and a lower passivation layer 303 provided on the bottom surface 103b of the second substrate 103 and partially covering the third metal pattern layer M3. The first metal pattern layer M1 may have a portion not covered with the upper passivation layer 301, and a plating layer, for example, a tin plating layer 209, may further be formed on the non-covered portion of the first metal pattern layer M1. The third metal pattern layer M3 may have a portion not covered with the lower passivation layer 303, and a plating layer, for example, a tin plating layer 209, may further be formed on the non-covered portion of the third metal pattern layer M3. For clarity, the tin plating layer 209 is not illustrated in FIGS. 3H and 3I described below.

Figure 3H:
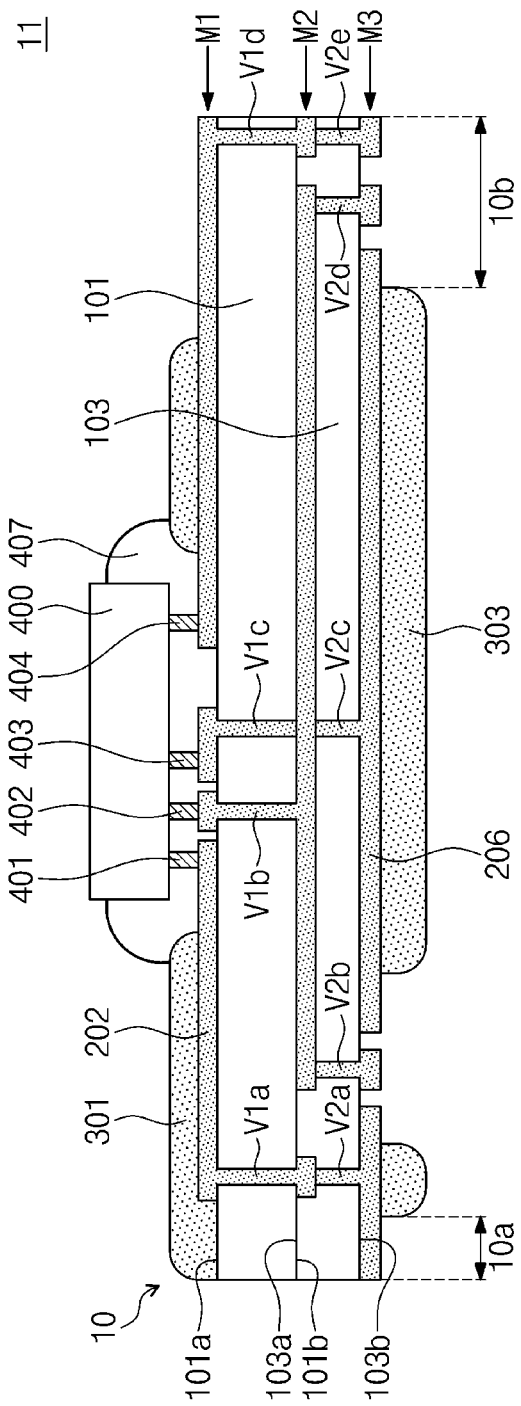

Referring to FIG. 3H, a semiconductor chip 400 may be mounted on the package substrate 10, which step may essentially complete the fabricating of a semiconductor package 11. The semiconductor package 11 may correspond to the semiconductor package 11 described above with reference to FIG. 1I. For example, the semiconductor chip 400 may include a display driver IC, or DDI. The semiconductor chip 400 and the first metal pattern layer M1 may be electrically connected through a plurality of connection terminals 401, 402, 403, and 404. First to third connection terminals 401, 402, and 403 among the connection terminals 401 to 404 may serve as output terminals, and fourth connection terminals 404 may serve as input terminals. An under-fill layer 407 may be formed between the package substrate 10 and the semiconductor chip 400, protecting the connection terminals 401 to 404 from the outside and preventing contact between the connection terminals 401 to 404. The semiconductor package 11 may include on one end 10a and an opposite end 10b thereof an electrical test structure similar to that discussed above with reference to FIG. 1I.

Figure 3I:
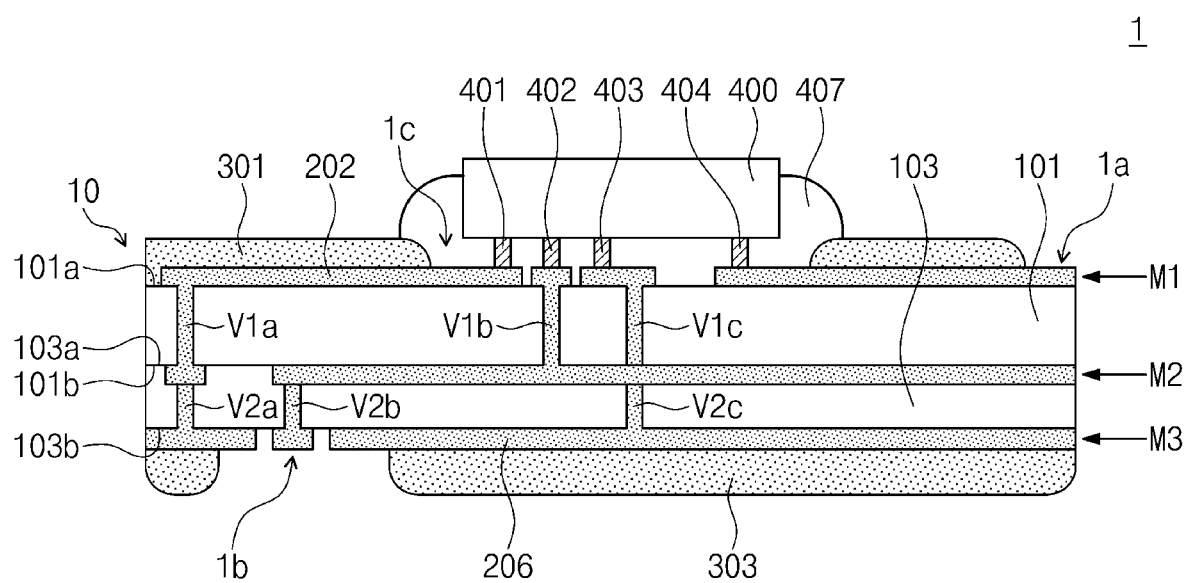

Referring to FIG. 3I, the one end 10a and the opposite end 10b of the semiconductor package 11 may be cut off to fabricate a semiconductor package 1 including an upper connection region 1a and a lower connection region 1b. The semiconductor package 1 may correspond to the semiconductor package 1 of FIG. 1A. The first metal pattern layer M1 may have a part exposed on the top surface 101a of the first substrate 101, and the exposed part of the first metal pattern layer M1 may constitute the upper connection region 1a capable of serving as an input terminal. The third metal pattern layer M3 may have a part exposed on the bottom surface 103b of the second substrate 103, and the exposed part of the third metal pattern layer M3 may constitute the lower connection region 1b capable of serving as an output terminal. The first metal pattern layer M1 may have another part below the semiconductor chip 400, and the other part of the first metal pattern layer M1 may constitute a chip connection region 1c electrically connected to the semiconductor chip 400.

According to inventive concepts, a package substrate may be provided with a plurality of stacked first to third metal patterns such that a plurality of pads having a minimal pitch may be used for electrical connection. A semiconductor package may be employed by an electronic product, such as a high resolution or multi-channel display panel, without pad misalignment and/or electrical short.

Finally, the inventive concepts should not be construed as limited to the examples described in detail herein. Rather, various other examples, and combinations, modifications and variations of the examples described herein are within the true spirit and scope of the inventive concepts as defined by the appended claims.

What is claimed is:

1. A semiconductor package, comprising:
   a semiconductor chip;
   a package substrate having a top surface on which the semiconductor chip is mounted and a bottom surface opposite to the top surface;
   an upper metal pattern layer on the top surface of the package substrate, the upper metal pattern layer having an upper connection region extending along one section of the top surface of the package substrate and dedicated for electrically connecting an external electrical device to the semiconductor package, and the upper metal pattern layer having a chip connection region at which the semiconductor chip is electrically connected to the upper metal pattern layer;

a lower metal pattern layer on the bottom surface of the package substrate, the lower metal pattern layer having a lower connection region extending along one section of the bottom surface of the package substrate and dedicated for electrically connecting another external electrical device to the semiconductor package; and an intermediate metal pattern layer in the package substrate and electrically connecting the upper metal pattern layer and the lower metal pattern layer, wherein the upper metal pattern layer comprises a plurality of first metal patterns comprising leads extending in a longitudinal direction on the top surface of the package substrate, the first metal patterns are disposed in a plurality of groups on the chip connection region, in each of the groups of the first metal patterns, the first metal patterns are spaced relative to each other in a direction intersecting the longitudinal direction in which the leads of the upper metal pattern layer extend, whereas the groups of the first metal patterns are offset from each other in the longitudinal direction in which the leads of the upper metal pattern layer extend, the intermediate metal pattern layer comprises a plurality of second metal patterns, the lower metal pattern layer comprises a plurality of third metal patterns comprising leads extending longitudinally on the bottom surface of the package substrate, and in each of the groups of the third metal patterns, the third metal patterns are spaced relative to each other in a direction intersecting the longitudinal direction in which the leads of the lower metal pattern layer extend, whereas the groups of the third metal patterns are offset from each other in the longitudinal direction in which the leads of the lower metal pattern layer extend.

2. The package of claim 1, wherein the package substrate comprises:
a first flexible substrate including a top surface on which the upper metal pattern layer is provided and a bottom surface on which the intermediate metal pattern layer is provided; and
a second flexible substrate including a top surface facing the bottom surface of the first flexible substrate and a bottom surface on which the lower metal pattern layer is provided.

3. The package of claim 1, further comprising a plurality of connection terminals interposed between the semiconductor chip and the package substrate,
wherein the connection terminals comprise:
a plurality of first output terminals arrayed in a first direction;
a plurality of second output terminals arrayed in the first direction, the plurality of second output terminals being offset in a second direction relative to the plurality of first output terminals, the second direction intersecting the first direction;
a plurality of third output terminals arrayed in the first direction, the plurality of third output terminals being offset in the second direction relative to plurality of the second output terminals; and a plurality of input terminals arrayed in the first direction, the plurality of input terminals being offset in the second direction relative to the plurality of third output terminals.

4. The package of claim 3, wherein the first metal patterns of the upper metal pattern layer comprise:
a plurality of first outer metal patterns electrically connected to the first output terminals and constituting a first one of said groups of the first metal patterns;
a plurality of first intermediate metal patterns electrically connected to the second output terminals and constituting a second one of said groups of the first metal patterns;
a plurality of first inner metal patterns electrically connected to the third output terminals and constituting a third one of said groups of the third metal patterns; and
a plurality of input metal patterns electrically connected to the input terminals and constituting a fourth one of said groups of the third metal patterns.

5. The package of claim 4, wherein the input metal patterns comprise outer leads constituting the upper connection region.

6. The package of claim 4, wherein the first outer metal patterns comprise leads extending longitudinally from below the first output terminals in a direction away from the upper connection region,
the first intermediate metal patterns comprise metal pads disposed directly under the second output terminals, respectively, and
the first inner metal patterns comprise leads extending longitudinally in a direction from below the third output terminals toward the upper connection region and/or the first inner metal patterns comprise metal pads disposed directly under the third output terminals.

7. The package of claim 3, wherein the plurality of second metal patterns of the intermediate metal pattern layer comprises:
a plurality of second outer metal patterns electrically connected to the first output terminals;
a plurality of second intermediate metal patterns electrically connected to the second output terminals; and
a plurality of second inner metal patterns electrically connected to the third output terminals,
wherein the second intermediate metal patterns extend from below the second output terminals to locations toward a region vertically aligned with the lower connection region.

8. The package of claim 3, wherein the plurality of third metal patterns of the lower metal pattern layer comprise:
a plurality of third outer metal patterns electrically connected to the first output terminals and constituting a first one of said groups of the third metal patterns;
a plurality of third intermediate metal patterns electrically connected to the second output terminals and constituting a second one of said groups of the third metal patterns; and
a plurality of third inner metal patterns electrically connected to the third output terminals and constituting a third one of said groups of the third metal patterns,
wherein the third inner metal patterns extend from below the third output terminals and constitute the lower connection region of the lower metal pattern layer.

9. The package of claim 8, wherein the third outer metal patterns comprise metal pads constituting the lower connection region, the third intermediate metal patterns comprise metal pads constituting the lower connection region, and the third inner metal patterns comprise metal pads constituting the lower connection region, the metal pads of the third outer metal patterns are disposed in a row as spaced from each other, the metal pads of the third intermediate metal patterns are disposed in a row as spaced from each other, and the metal pads of the third inner metal patterns are disposed in a row as spaced from each other, and in each said row of the metal pads, the metal pads of the row are spaced from each other in a direction intersecting the longitudinal direction in which the leads of the lower metal pattern layer extend, whereas the rows of the metal pads are spaced from each other in the longitudinal direction in which the leads of the lower metal pattern layer extend.

10. The package of claim 8, wherein the third outer metal patterns comprise a plurality of metal pads electrically connected to the first output terminals and constituting the lower connection region of the lower metal pattern layer, the third intermediate metal patterns comprise a plurality of metal pads electrically connected to the second output terminals and constituting the lower connection region of the lower metal pattern layer, and the third inner metal patterns comprise a plurality of metal pads electrically connected to the third output terminals and constituting the lower connection region of the lower metal pattern layer.

11. The package of claim 1, further comprising:

an upper metal via extending vertically and electrically connecting the upper metal pattern layer and the intermediate metal pattern layer; and a lower metal via extending vertically between and electrically connecting the intermediate metal pattern layer and the lower metal pattern layer.

12. The package of claim 1, further comprising a plurality of additional electrical patterns on opposite ends of the package substrate.

13. The package of claim 12, wherein the upper metal pattern layer, the lower metal pattern layer, and the intermediate metal pattern layer collectively extend toward the opposite ends of the package substrate, and each of the additional electrical patterns is integral with one of upper metal pattern layer, the lower metal pattern layer, and the intermediate metal pattern layer.

14. A semiconductor package, comprising:

a semiconductor chip;

a first substrate having a first top surface on which the semiconductor chip is mounted and a first bottom surface opposite to the first top surface;

a second substrate having a second top surface facing the first bottom surface and a second bottom surface opposite to the second top surface;

a first metal pattern layer on the first top surface, the first metal pattern layer including a chip connection region at which the semiconductor chip is electrically connected to the first metal pattern layer and an upper connection region dedicated for electrically connecting the semiconductor package to an external electrical device, the upper connection region located along a section of the first top surface;

a second metal pattern layer on the first bottom surface and electrically connected to the first metal pattern layer; and a third metal pattern layer on the second bottom surface and electrically connected to the second metal pattern layer, the third metal pattern layer having a lower connection region on a section of the second bottom surface, the lower connection region dedicated for electrically connecting another external electrical device to the semiconductor package, wherein the first metal pattern layer comprises a plurality of first metal patterns comprising leads extending in a longitudinal direction on the first top surface, the first metal patterns are disposed in a plurality of groups on the chip connection region, in each of the groups of the first metal patterns, the first metal patterns are spaced relative to each other in a direction intersecting the longitudinal direction in which the leads of the first metal pattern layer extend, whereas the groups of the first metal patterns are offset from each other in the longitudinal direction in which the leads of the first metal pattern layer extend, the second metal pattern layer comprises a plurality of second metal patterns on the first bottom surface, the third metal pattern layer comprises a plurality of third metal patterns comprising leads extending longitudinally on the second bottom surface, and in each of the groups of the third metal patterns, the third metal patterns are spaced relative to each other in a direction intersecting the longitudinal direction in which the leads of the third metal pattern layer extend, whereas the groups of the third metal patterns are offset from each other in the longitudinal direction in which the leads of the third metal pattern layer extend.

15. The package of claim 14, further comprising:

a plurality of connection terminals interposed between the semiconductor chip and the first substrate;

a plurality of first metal vias extending through the first substrate and electrically connecting the first metal patterns to the second metal patterns; and a plurality of second metal vias extending through the second substrate and electrically connecting the second metal patterns to the third metal patterns.

16. The package of claim 15, wherein the connection terminals comprise:

a plurality of first output terminals, the first output terminals being spaced relative to each other along a first direction;

a plurality of second output terminals, the second output terminals being spaced relative to each other along the first direction, and the plurality of second output terminals being offset in a second direction from the plurality of first output terminals, the second direction intersecting the first direction;

a plurality of third output terminals, the third output terminals being spaced relative to each other along the first direction, and the plurality of third output terminals being offset in the second direction from the plurality of second output terminals; and a plurality of input terminals, the input terminals being spaced relative to each other along the first direction, and the plurality of input terminals being offset in the second direction from the plurality of third output terminals, wherein the first direction is parallel to the direction intersecting the longitudinal direction in which the leads of the third metal pattern layer extend, and the second direction is parallel to the longitudinal direction in which the leads of the third metal pattern layer extend.

17. The package of claim 16, wherein the first metal pattern layer comprises:

a plurality of first outer metal patterns electrically connected to the first output terminals and constituting a first one of the groups of the first metal patterns;

a plurality of first intermediate metal patterns electrically connected to the second output terminals and constituting a second one of the groups of the first metal patterns;

a plurality of first inner metal patterns electrically connected to the third output terminals and constituting a third one of the groups of the first metal patterns; and a plurality of input metal patterns electrically connected to the input terminals and partially exposed on the first top surface so as to constitute the upper connection region, wherein each of the first outer metal patterns and the input metal patterns comprise a respective one of the leads of the first metal pattern layer, and each of the first intermediate metal patterns and the first inner metal patterns comprise a respective one of the leads of the first metal pattern layer and/or each of the first outer metal patterns and the input metal patterns comprise a metal pad.

18. The package of claim 16, wherein the second metal pattern layer comprises:

a plurality of second outer metal patterns electrically connected to the first output terminals;

a plurality of second intermediate metal patterns electrically connected to the second output terminals; and a plurality of second inner metal patterns electrically connected to the third output terminals, wherein respective ones of the second intermediate metal patterns extend along the second direction from below the second output terminals toward a region vertically aligned with the lower connection region, and others of the second intermediate metal patterns extend along the second direction from below the second output terminals toward a region vertically aligned with the upper connection region.

19. The package of claim 16, wherein the third metal pattern layer comprises:

a plurality of third outer metal patterns electrically connected to the first output terminals and constituting a first one of the groups of the third metal patterns;

a plurality of third intermediate metal patterns electrically connected to the second output terminals and constituting a second one of the groups of the third metal patterns; and a plurality of third inner metal patterns electrically connected to the third output terminals and constituting a third one of the groups of the third metal patterns, wherein respective ones of the third inner metal patterns extend along the second direction from below the third output terminals and constitute the lower connection region, and others of the third inner metal patterns extend along the second direction from below the third output terminals toward a region vertically aligned with the upper connection region.

20. The package of claim 14, wherein the first and second substrates comprise flexible substrates made of insulating materials.

* * * * *